(12) United States Patent
Capasso et al.

(10) Patent No.: US 11,948,763 B1
(45) Date of Patent: Apr. 2, 2024

(54) ACTUATION DEVICE, HALF-BRIDGE CIRCUIT ARRANGEMENT COMPRISING SAME AND METHOD THEREFOR

(71) Applicant: SEMIKRON DANFOSS ELEKTRONIK GMBH & CO. KG, Nuremberg (DE)

(72) Inventors: Orlando Capasso, Nuremberg (DE); Michael Kettler, Happurg (DE); Alexander Mühlhöfer, Oberasbach (DE); Daniel Obermöder, Iphofen (DE)

(73) Assignee: SEMIKRON DANFOSS ELEKTRONIK GMBH & CO., KG, Nuremberg (DE)

( * ) Notice: Subject to any disclaimer, the term of this patent is extended or adjusted under 35 U.S.C. 154(b) by 0 days.

(21) Appl. No.: 18/519,852

(22) Filed: Nov. 27, 2023

(30) Foreign Application Priority Data

Dec. 21, 2022 (DE) ............... 10 2022 134 287.5

(51) Int. Cl.
*H01H 33/59* (2006.01)
*H01H 9/54* (2006.01)
(Continued)

(52) U.S. Cl.
CPC .......... *H01H 33/596* (2013.01); *H01H 9/542* (2013.01); *H02H 3/021* (2013.01); *H02H 3/087* (2013.01)

(58) Field of Classification Search
CPC ...... H01H 33/596; H01H 9/542; H02H 3/021; H02H 3/087
See application file for complete search history.

(56) References Cited

U.S. PATENT DOCUMENTS

| 5,949,273 A * | 9/1999 | Mourick | ............... H03K 17/12 |
| | | | 327/434 |
| 10,931,093 B2 * | 2/2021 | Gerdinand | ............. H02H 3/087 |

(Continued)

FOREIGN PATENT DOCUMENTS

| DE | 19628131 A1 | 1/1998 |
| DE | 102016209630 A1 * | 12/2017 |

(Continued)

OTHER PUBLICATIONS

Dalton, J. J. O. et al.: Shaping switching waveforms in a 650 V GaN FET bridge-leg using 6.7 GHz active gate drivers. In: 2017 IEEE Applied Power, Electronics Conference and Exposition (APEC), 2017, S. 1983-1989.

(Continued)

*Primary Examiner* — Jared Fureman
*Assistant Examiner* — Nicolas Bellido
(74) *Attorney, Agent, or Firm* — Andrew F. Young; NOLTE LACKENBACH SIEGEL

(57) ABSTRACT

An actuation device for actuating a circuit breaker, has a circuit arrangement and a plurality of resistor devices, wherein a plurality of first switching elements of the circuit arrangement are connected to a respectively assigned first voltage source and a respectively assigned resistor device and have a switching input that is connected to an actuation logic unit, wherein this actuation logic unit furthermore has a superordinate actuation input and a plurality of sensor inputs. A method for operating such an actuation device is also presented, wherein, during the switching-on or the switching-off process of the circuit breaker, the plurality of first switching elements are switched on in a clocked manner and therefore generate a target voltage profile at the control input of the circuit breaker.

12 Claims, 2 Drawing Sheets

(51) Int. Cl.
H02H 3/02 (2006.01)
H02H 3/087 (2006.01)

(56) References Cited

U.S. PATENT DOCUMENTS

2013/0009671 A1    1/2013  Suzuki et al.
2019/0379373 A1*  12/2019  Böhmer ............ H03K 17/0422

FOREIGN PATENT DOCUMENTS

DE    102016217494 A1 *  3/2018  .............. B60L 15/08
EP         3352375 A1 *  7/2018  .............. H03K 17/00

OTHER PUBLICATIONS

Obara, H. et al.: Active Gate Control in Half-Bridge Inverters Using Programmable Gate Driver ICs to Improve Both Surge Voltage and Converter, Efficiency. In: IEEE Transactions on Industry Applications, 2018, S. 4603-4611.
Liu, D. et al.: Full Custom Design of an Arbitrary Waveform Gate Driver With 10-GHz Waypoint Rates for GaN FETs. In: IEEE Transactions on Power Electronics, 2021, S. 8267-8279.
DE 10 2022 134 287.5, German Search Report dated Jul. 26, 2023, 7 pages—German, 7 pages—English; Certification of Translation dated Dec. 1, 2023.

\* cited by examiner

ACTUATION DEVICE, HALF-BRIDGE CIRCUIT ARRANGEMENT COMPRISING SAME AND METHOD THEREFOR

CROSS REFERENCE TO RELATED APPLICATIONS

This application relates to and claims priority to DE 10 2022 134 287.5 filed Dec. 21, 2022, the entire contents of which are incorporated herein fully by reference.

FIGURE SELECTED FOR PUBLICATION

FIG. 1.

BACKGROUND OF THE INVENTION

Field of the Invention

The invention describes an actuation device, and a method for actuating a circuit breaker, comprising a circuit arrangement and a plurality of resistor devices. The invention furthermore describes a half-bridge circuit arrangement comprising two circuit breakers that are connected in series and the control input of which is in each case connected to an actuation device, wherein the first, upper circuit breaker is connected to a first DC voltage connection by way of its load input, and the second, lower circuit breaker is connected to a second DC voltage input by way of its load output, and wherein the centre tap of the series connection of the circuit breakers is connected to an AC voltage connection.

Description of the Related Art

DE 196 28 131 A1 discloses a circuit arrangement of the high power density power class, the short-circuit strength of which is significantly increased by targeted circuitry measures. The objective of short-circuit strength is achieved by way of a modified circuit for gate actuation of the switching transistors. In the case of a high packing density of the circuit arrangement and fast switching frequencies, the gate voltages in parallel circuits according to the prior art are changed so considerably in the event of a short circuit, in spite of the inherently natural current limitation of each individual switch, that this results in the destruction of the entire arrangement. The use of gate resistors and fast diodes in the circuit design effectively counteracts the destruction of the circuit arrangement in the event of a short circuit.

ASPECTS AND OBJECTS OF THE INVENTION

At least one of the objects of the present invention is to provide an improvement over the related art.

According to one alternative aspect of the present invention, there is provided an actuation device for actuating a circuit breaker, has a circuit arrangement and a plurality of resistor devices, wherein a plurality of first switching elements of the circuit arrangement are connected to a respectively assigned first voltage source and a respectively assigned resistor device and have a switching input that is connected to an actuation logic unit, wherein this actuation logic unit furthermore has a superordinate actuation input and a plurality of sensor inputs. A method for operating such an actuation device is also presented, wherein, during the switching-on or the switching-off process of the circuit breaker, the plurality of first switching elements are switched on in a clocked manner and therefore generate a target voltage profile at the control input of the circuit breaker.

The invention is based on the object of designing the actuation device, a method and a half-bridge circuit arrangement comprising said actuation device in such a way that the circuit breaker to be respectively actuated thereby can be actuated precisely and in a manner depending on requirements, in particular by different characteristic variables.

This object is achieved according to the invention by an actuation device for actuating a circuit breaker, comprising a circuit arrangement and a plurality of resistor devices, wherein a plurality of first switching elements of the circuit arrangement are connected to a respectively assigned first voltage source and a respectively assigned resistor device and have a switching input that is connected to an actuation logic unit, wherein this actuation logic unit furthermore has a superordinate actuation input and a plurality of sensor inputs.

This particular configuration of the actuation device is particularly expedient for deactivating a circuit breaker, but can alternatively or additionally also be used for switching on the circuit breaker.

It is particularly advantageous if the respective sensor input is connected to a measuring device selected from:
  direct or indirect voltage monitoring between the load input and load output of the circuit breaker,
  voltage monitoring between the control input and the load output of the circuit breaker,
  current monitoring of the current between the load input and load output of the circuit breaker,
  direct or indirect temperature monitoring of the circuit breaker,
  further voltage monitoring of a DC voltage.

It may be particularly preferred for the actuation logic unit to be designed to actuate the first switching elements in a clocked manner during the switching-on or the switching-off process of the circuit breaker.

The term "actuate in a clocked manner" should be understood here and below to mean that at least one of the following conditions is met during the period of time during which a switch-off command is applied:
  at least one of the first switching elements is switched off;
  at least two of the first switching elements are switched off;
  one of the first switching elements is switched on with a delay compared to another first switching element;
  at least one of the first switching elements is repeatedly switched off.

In this case, it is also advantageous for the actuation logic unit to be designed to process the sensor signals in any combination to form a parameter set that influences the clocking of the first switching elements.

Furthermore, it is advantageous for the actuation logic unit to be designed to process the sensor signals in any weighting to form a parameter set that influences the clocking of the first switching elements.

It may be particularly advantageous for the respective first voltage sources to have an identical voltage.

It may also be advantageous for the circuit arrangement to have a second switching element that is connected to an assigned second voltage source and an assigned resistor device, and has a switching input, wherein the actuation logic unit is designed to actuate this second switching element in an unclocked manner during the switching-on or the switching-off process of the circuit breaker. It is particularly advantageous in this case for the voltage of the second voltage source to be identical to the voltage of the first voltage source.

It may also be preferred for the circuit arrangement to have a third switching element that is connected to an assigned third voltage source and an assigned resistor device, and has a switching input, wherein the actuation logic unit is designed to actuate this third switching element in an unclocked manner during the switching-on or the switching-off process of the circuit breaker, and wherein the voltage of the third voltage source is different to the voltage of the first voltage source.

The object is furthermore achieved by a half-bridge circuit arrangement comprising two circuit breakers that are connected in series and the control input of which is in each case connected to an actuation device according to one of the preceding claims, wherein the first, upper circuit breaker is connected to a first DC voltage connection by way of its load input, and the second, lower circuit breaker is connected to a second DC voltage input by way of its load output, and wherein the centre tap of the series connection of the circuit breakers is connected to an AC voltage connection.

It may be preferred in this case for the circuit breaker to be in the form of a power semiconductor component or of a group of power semiconductor components connected in parallel, wherein the respective power semiconductor component is in the form of an IGBT or a MOSFET, in particular of a SiC MOSFET.

Furthermore, it may be preferred for a circuit breaker to be in the form of an upper or lower partial branch of a three-level or multi-level bridge circuit.

The object is furthermore achieved by a method for operating an actuation device as mentioned above, wherein, during the switching-on or the switching-off process of the circuit breaker, the plurality of first switching elements are switched on in a clocked manner and therefore generate a target voltage profile at the control input of the circuit breaker.

It may be advantageous for the respective first switching elements to be clocked in a manner offset from one another. It may be particularly preferred for at least two first switching elements to be switched on simultaneously during the clocked operation.

Of course, unless this is explicitly excluded or excluded per se or contradicts the concept of the invention, the features mentioned in the singular in each case can be present several times in the actuation device according to the invention or the half-bridge circuit arrangement.

It goes without saying that the various configurations of the invention, regardless of whether they are mentioned in connection with the actuation device, with the half-bridge circuit arrangement or with the methods, can be realized individually or in any combinations in order to achieve improvements. In particular, the features mentioned and explained above and hereinafter are able to be used not only in the combinations indicated, but also in other combinations or by themselves, without departing from the scope of the present invention.

Further explanations of the invention, advantageous details and features are evident from the following description of the exemplary embodiments of the invention that are illustrated schematically in FIGS. 1 to 4, or from respective parts thereof.

The above and other aspects, features, objects, and advantages of the present invention will become apparent from the following description read in conjunction with the accompanying drawings for exemplary but nonlimiting embodiments, in which like reference numerals designate the same elements.

DETAILED DESCRIPTION OF THE PREFERRED EMBODIMENTS

Figure 1:
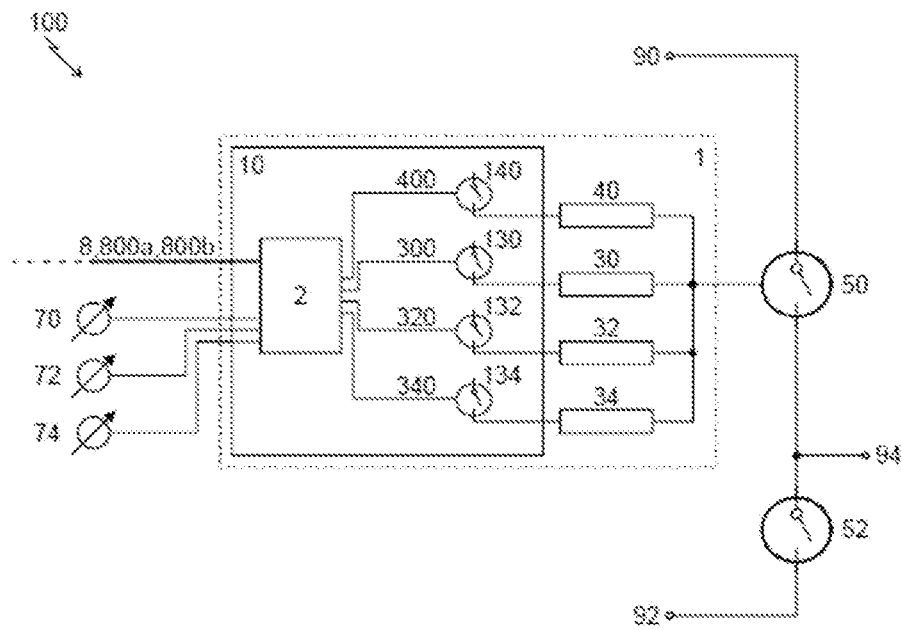
FIG. 1 shows a half-bridge circuit arrangement according to the invention comprising an actuation device according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'bond' or and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIG. 1 shows a half-bridge circuit arrangement 100 according to the invention comprising an actuation device 1 according to the invention. In this case, the half-bridge circuit arrangement 100 has two circuit breakers 50, 52 that are connected in series, wherein the first, upper circuit breaker 50 is connected to a first DC voltage connection 90 of a DC voltage source, while the second, lower circuit breaker 52 is connected to a second DC voltage connection 92 of a DC voltage source. An alternating potential 94 results at the centre tap between the two circuit breakers 50, 52 during operation.

Here, this DC voltage source forms the DC link of a power circuit, which, as is conventional in the art, also has a plurality of identical series connections.

Figure 3:
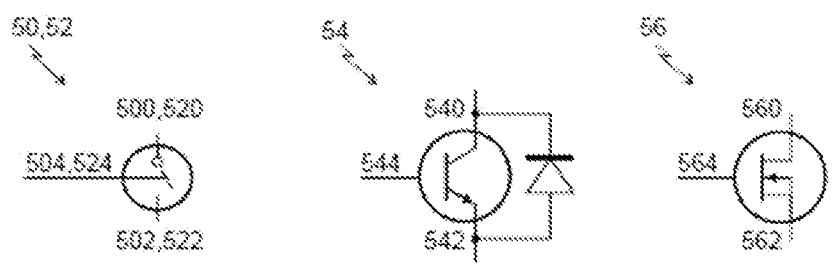

As shown in FIG. 3, each of these circuit breakers 50, 52 has a load input 500, 520, a load output 502, 522 and a control input 504, 524. Each of the circuit breakers 50, 52 can be in the form of an IGBT 54 with a power diode connected in antiparallel. The collector connection 540 then forms the load input 500, the emitter connection 542 forms the load output 502 and the gate connection 544 forms the control input 504. Alternatively, the respective circuit breaker 50, 52 can also be in the form of a MOSFET 56, in particular preferably of a MOSFET with a high band gap, i.e. a SiC or GaN MOSFET. Then the drain connection 560 forms the load input 500, the source connection 562 forms the load output 502 and the gate connection 564 forms the control connection 504.

Of course, each of the circuit breakers 50, 52 can also be in the form of a parallel connection of a plurality of IGBTs 54 or MOSFETs 56. The half-bridge circuit arrangement 100 of the circuit breakers 50, 52 is also not limited to a two-level bridge circuit.

Purely by way of example, only the actuation device 1 of the first circuit breaker 50 is shown here. Analogously, an identical actuation device 1 can also be provided for the second circuit breaker 52, or the actuation device 1 can contain the necessary components for the actuation of both circuit breakers. The actuation device 1 can also have different reference potentials, which then lead to two galvanically isolated partial actuation devices.

Figure 4:
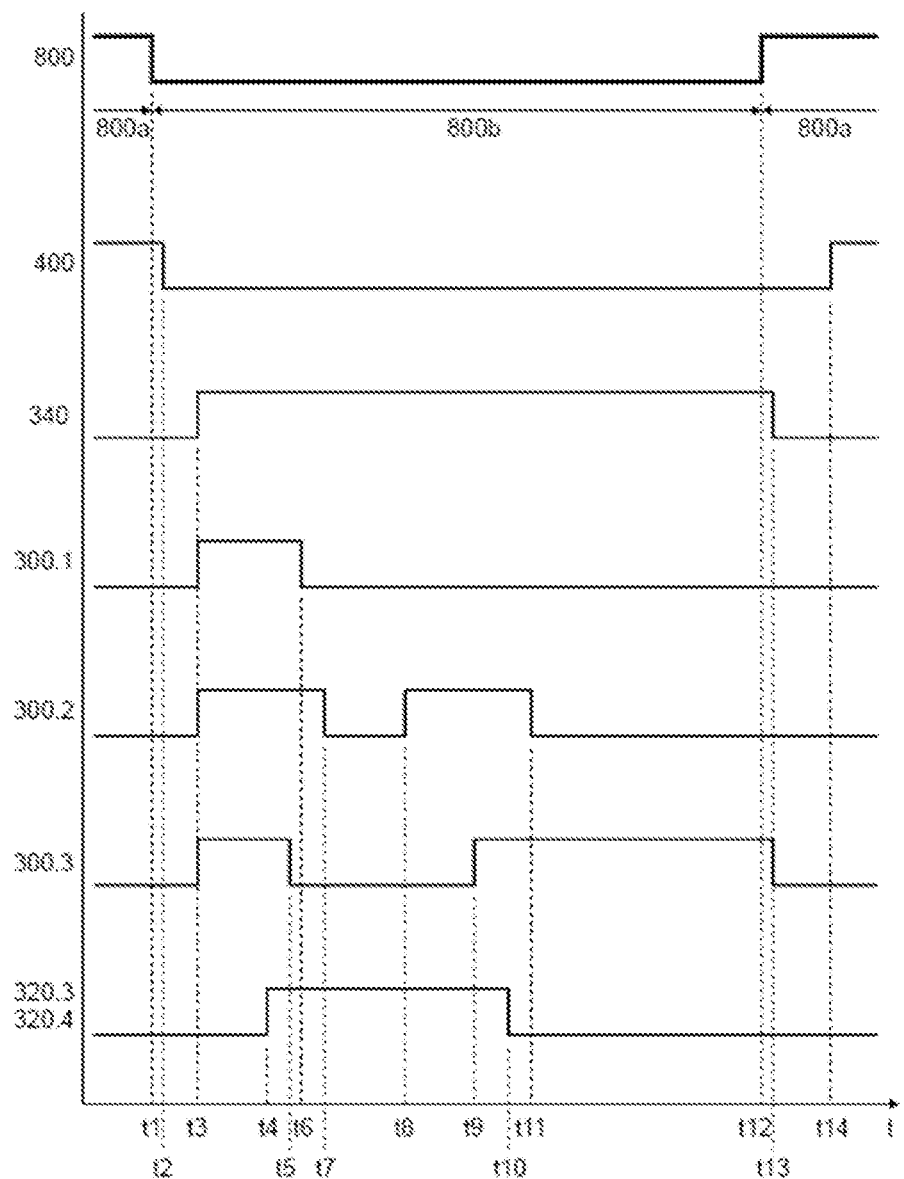
FIG. 4 shows various signal profiles upon application of the method according to the invention.

The actuation device 1 itself has a circuit arrangement 10, which provides an input 8 for a control signal that sends switching commands 800a, 800b, cf. also FIG. 4, from a superordinate control device for the circuit breaker 50.

The circuit arrangement 10 furthermore has a plurality of, in this case purely by way of example three, inputs for sensor signals 70, 72, 74 present in analogue or digital form. One of these sensor signals 70 relates to the voltage profile across the circuit breaker 50, which in this case is indirectly determined from the voltage between the two potentials of the DC link. Another sensor signal 72 relates to the voltage profile between the control input 504 and the load output 502 of the circuit breaker 50. A further sensor signal 74 relates to the temperature of the circuit breaker 50, which is indirectly determined via the temperature of a substrate on which the half-bridge circuit arrangement 100 is arranged.

Figure 2:
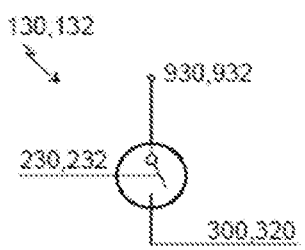
FIGS. 2 and 3 show details of components thereof.

In this case, the circuit arrangement 10 has four outputs that are connected to a respective switching element 130, 132, 134, 140, cf. also FIG. 2, the input of which is connected to a voltage source 930, 932 and the output of which is connected to the control input 504 of the circuit breaker 50 via an assigned resistor device 30, 32, 34, 40.

On the basis of the switching commands 800a, 800b from the superordinate control device, and with the inclusion and evaluation and weighting of the sensor signals 70, 72, 74, the actuation logic unit 2 determines a respective target voltage profile at the control input 504 of the circuit breaker 50. In this case, additional parameters or, in particular, one or more fault signals can be taken into account. The actuation logic unit 2 is therefore designed to process the sensor signals 70, 72, 74 in any combination to form a parameter set. The actuation logic unit 2 is also designed to process the sensor signals 70, 72, 74 in any weighting to form a parameter set.

In order to achieve a respective target voltage profile, the actuation logic unit 2 can, according to the invention, connect the control input 504 to a first voltage source 930 feeding a first switching element 130,132 in a clocked manner by means of the first switching element 130, 132. Alternatively, the target voltage profile can be achieved by clocked switching of one of the first switching elements 130, 132 and by unclocked switching of another, second switching element 134. The target voltage profile can also be supplemented by both alternatives in order to carry out the clocked switching of another first switching element 130, 132, cf. also FIG. 4 in this regard.

In this exemplary embodiment, the two first and the second switching element 130, 132, 134 are connected to a common first voltage source 930 with a voltage of −8V and serve to switch off the circuit breaker 50, which in this case is in the form of an IGBT 54. In this case, the first and second voltage sources are therefore only a single voltage source.

In order to achieve an alternative target voltage profile, the actuation logic unit 2 can additionally exclusively switch unclocked further second or third switching elements 134, 140 in a manner that is conventional in the art. In order to switch on the circuit breaker 50, in this case the control input 504 of the circuit breaker 50 is connected to a third voltage source with a voltage of +15 V by means of the third switching element 140 and the assigned resistor device 40.

The circuit arrangement 10 can also have a plurality of further function blocks that are conventional in the art in driver circuits for circuit breakers 50, 52. In principle, single or multiple function blocks, in particular the actuation logic unit 2, can be wholly or partly in the form of integrated circuits.

FIG. 4 shows various signal profiles upon application of the method according to the invention. The idealized profiles of the switching commands 800 from the superordinate control device are shown, as well as various control signals 300, 32, 340, 400 from the actuation logic unit 2 to the switching elements 130, 132, 134, 140, cf. FIG. 1.

The starting point is a situation in which the circuit breaker 50 is in the switched-on state, wherein in this case a switching command 800a, in this case a logic one, is applied by the superordinate control device. At the time t1, the superordinate control device applies a new switching command 800b, a logic zero, to the input for the control signal, which means the command for switching off the previously switched-on circuit breaker 50. This switching command 800b is applied continuously until the time t12, followed by a further switching command 800a, again a logic one, which corresponds to the command to switch on the circuit breaker 50.

After an inevitable delay owing to the real technical possibilities, the actuation logic unit 2 changes the level at the input of the third switching element 134 from on to off at the time t2, as a result of which the third switching element 134 interrupts the connection of the control input 504 of the circuit breaker 50 to the second voltage source 932.

Following a waiting time to avoid a bridge short circuit, and at the time t3, the actuation logic unit 2 changes the level at the input of the second switching element 134 from off to on, as a result of which the second switching element 134 establishes the connection of the control input 504 of the circuit breaker 50 to the first voltage source 930. This switching state continues to exist until the switch-off command is received at the time t2. Subsequently, at the time t13, again following a waiting time that is defined on the basis of technical aspects, the actuation logic unit 2 changes the level at the input of the second switching element 134 from on to off, as a result of which the second switching element 134 interrupts the connection of the control input 504 of the circuit breaker 50 to the first voltage source 930.

Following a further waiting time to avoid a bridge short circuit, and at the time t14, the actuation logic unit 2 changes the level at the input of the third switching element 140 from off to on, as a result of which the third switching element 140 establishes the connection of the control input 504 of the circuit breaker 50 to the second voltage source 932. Therefore, the circuit breaker 50 was switched off once and then switched on again in the time period shown.

The previously described behaviour of the actuation logic unit 2 for controlling the second and third switching elements 134, 140 corresponds to the conventional prior art.

According to the invention, two first switching elements 130, 132 with the associated voltage profiles 300, 320 shown here, for actuation thereof by means of the actuation logic unit 2, are introduced in this exemplary embodiment, which is oriented to FIG. 1.

In a first variant, in addition to the actuation of the second switching element 134, a first switching element 130 is simultaneously switched on at the time t3, but switched off again before the time t12 is reached, specifically at the time 6.

In a second variant 300.2, in addition to the actuation of the second switching element 134, a first switching element 130 is simultaneously switched on at the time t3, switched off at the time t7 and switched on again at the time t8, and switched off again at the time t11.

In a third variant 300.3, 320.3, the second switching element 134 is not used, but one of the first switching elements 130 is switched on at the time t3, switched off at the time t5 and switched on again at the time t9, but switched off again before the time t12 is reached, specifically at the time t13. While this first switching element 130 is still switched on, another first switching element 320 is also switched on at the time t4, and is already switched off again at the time t10.

In a fourth variant 320.4, only the described further first switching element 132 is switched on and off as described above.

These variants for actuating the first switching devices 130, 132, together with or without actuation of a second switching device 134, all show purely exemplary possible variants of the method according to the invention to switch off the circuit breaker 50, which of course is neither restricted to these variants nor to the switching-off.

Also, the inventors intend that only those claims which use the specific and exact phrase "means for" are intended to be interpreted under 35 USC 112. The structure, device, and arrangement herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure covers modifications and variations of this disclosure provided they come within the scope of the appended claims and their equivalents.

What is claimed is:

1. An actuation device, for actuating a circuit breaker, comprising:
   a circuit arrangement and a plurality of resistor devices;
   a plurality of first switching elements of the circuit arrangement are connected to a respectively assigned first voltage source and a respectively assigned resistor device and have a switching input that is connected to an actuation logic unit; and
   wherein the actuation logic unit further comprises:
   a superordinate actuation input and a plurality of sensor inputs;
   wherein the actuation logic unit is designed to actuate the first switching elements in a clocked manner during the switching-on or the switching-off process of the circuit breaker;
   wherein the respective first voltage sources have an identical voltage;
   wherein the circuit arrangement has a second switching element that is connected to an assigned second voltage source and an assigned resistor device, and has a switching input; and
   wherein the actuation logic unit is designed to actuate this second switching element in an unclocked manner during the switching-on or the switching-off process of the circuit breaker.

2. The actuation device, according to claim 1, wherein:
   the respective sensor input is connected to a measuring device that is selected from, at least one of:
   i. a direct or an indirect voltage monitoring between the load input and load output of the circuit breaker,
   ii. a voltage monitoring between the control input and the load output of the circuit breaker,
   iii. a current monitoring of the current between the load input and load output of the circuit breaker,
   iv. a direct or an indirect temperature monitoring of the circuit breaker, and
   v. a further voltage monitoring of a DC voltage.

3. The actuation device, according to claim 1, wherein:
   the actuation logic unit is designed to process the sensor signals in any combination to form a parameter set that influences the clocking of the first switching elements.

4. The actuation device, according to claim 1, wherein:
   the actuation logic unit is designed to process the sensor signals in any weighting to form a parameter set that influences the clocking of the first switching elements.

5. The actuation device, according to claim 1, wherein:
   the voltage of the second voltage source is identical to the voltage of the first voltage source.

6. The actuation device, according to claim 1, wherein:
   the circuit arrangement further comprises:
   a third switching element that is connected to an assigned third voltage source and an assigned resistor device, and has a switching input;
   wherein the actuation logic unit is designed to actuate the third switching element in an unclocked manner during the switching-on or the switching-off process of the circuit breaker; and
   wherein the voltage of the third voltage source is different to the voltage of the first voltage source.

7. A half-bridge circuit arrangement, comprising:
   two circuit breakers that are connected in series;
   each of said two circuit breakers has a respective control input which in each case is connected to an actuation device, for actuating a circuit breaker, said actuation device further comprising:
   a circuit arrangement and a plurality of resistor devices;
   a plurality of first switching elements of the circuit arrangement are connected to a respectively assigned first voltage source and a respectively assigned resistor device and have a switching input that is connected to an actuation logic unit; and
   wherein the actuation logic unit, further comprises:
   a superordinate actuation input and a plurality of sensor inputs; and
   wherein the actuation logic unit is designed to actuate the first switching elements in a clocked manner during the switching-on or the switching-off process of the circuit breaker;
   wherein the respective first voltage sources have an identical voltage;
   wherein the circuit arrangement has a second switching element that is connected to an assigned second voltage source and an assigned resistor device, and has a switching input;
   wherein the actuation logic unit is designed to actuate this second switching element in an unclocked manner during the switching-on or the switching-off process of the circuit breaker;

wherein the first, upper circuit breaker is connected to a first DC voltage connection by way of its load input, and the second, lower circuit breaker is connected to a second DC voltage input by way of its load output; and wherein a centre tap of the series connection of the circuit breakers is connected to an AC voltage connection.

8. The half-bridge circuit arrangement, according to claim 7, wherein:

the circuit breaker is in the form of a power semiconductor component or of a group of power semiconductor components connected in parallel; and wherein the respective power semiconductor component is in the form of an IGBT or a MOSFET, in particular of a SiC MOSFET.

9. The half-bridge circuit arrangement, according to claim 8, wherein:

the circuit breaker is in the form of an upper or lower partial branch of a three-level or multi-level bridge circuit.

10. A method, for operating an actuation device, comprising the steps of:

providing the actuation device, according to claim 1, wherein:

the actuation device for actuating a circuit breaker, comprises:

a circuit arrangement and a plurality of resistor devices;

a plurality of first switching elements of the circuit arrangement are connected to a respectively assigned first voltage source and a respectively assigned resistor device and have a switching input that is connected to an actuation logic unit; and wherein the actuation logic unit further comprises:

a superordinate actuation input and a plurality of sensor inputs; and wherein the actuation logic unit is designed to actuate the first switching elements in a clocked manner during the switching-on or the switching-off process of the circuit breaker;

wherein the respective first voltage sources have an identical voltage;

wherein the circuit arrangement has a second switching element that is connected to an assigned second voltage source and an assigned resistor device, and has a switching input; and wherein the actuation logic unit is designed to actuate this second switching element in an unclocked manner during the switching-on or the switching-off process of the circuit breaker; and during the switching-on or the switching-off process of the circuit breaker, the plurality of first switching elements are switched on in a clocked manner and therefore generate a target voltage profile at the control input of the circuit breaker.

11. The method, according to claim 10, wherein:

the respective first switching elements are clocked in a manner offset from one another.

12. The method, according to claim 11, wherein:

at least two first switching elements are switched on simultaneously during the clocked operation.

* * * * *